US012787505B2

(12) United States Patent
Fan

(10) Patent No.: US 12,787,505 B2
(45) Date of Patent: Nov. 3, 2026

(54) DISPLAY PANEL AND MANUFACTURING METHOD THEREOF

(71) Applicant: XIAMEN EXTREMELY PQ DISPLAY TECHNOLOGY CO., LTD., Xiamen (CN)

(72) Inventor: Yong Fan, Xiamen (CN)

(73) Assignee: XIAMEN EXTREMELY PQ DISPLAY TECHNOLOGY CO., LTD., Xiamen (CN)

( * ) Notice: Subject to any disclaimer, the term of this patent is extended or adjusted under 35 U.S.C. 154(b) by 173 days.

(21) Appl. No.: 18/572,868

(22) PCT Filed: Dec. 30, 2021

(86) PCT No.: PCT/CN2021/143347
§ 371 (c)(1),
(2) Date: Dec. 21, 2023

(87) PCT Pub. No.: WO2023/123277
PCT Pub. Date: Jul. 6, 2023

(65) Prior Publication Data
US 2024/0355969 A1 Oct. 24, 2024

(51) Int. Cl.
*H10H 20/84* (2025.01)
*H10H 20/01* (2025.01)
(Continued)

(52) U.S. Cl.
CPC ............ *H10H 20/84* (2025.01); *H10H 20/01* (2025.01); *H10H 20/8515* (2025.01);
(Continued)

(58) Field of Classification Search
CPC .... H10H 20/84; H10H 20/01; H10H 20/8515; H10H 20/856; H10H 20/0361; H10H 20/0363; H10W 90/00
See application file for complete search history.

(56) References Cited

U.S. PATENT DOCUMENTS

2008/0129189 A1* 6/2008 Cok ........................ B82Y 20/00 313/506
2009/0322207 A1* 12/2009 Toyoguchi ............ H01J 29/864 313/495
(Continued)

FOREIGN PATENT DOCUMENTS

CN 104090419 A 10/2014
CN 106684108 A 5/2017
(Continued)

OTHER PUBLICATIONS

International Search Report in International application No. PCT/CN2021/143347, mailed on May 26, 2022.
(Continued)

*Primary Examiner* — Herve-Louis Y Assouman
(74) *Attorney, Agent, or Firm* — Nathan & Associates; Menachem Nathan

(57) ABSTRACT

A display panel and a manufacturing method thereof are provided. In the present application, a light-absorbing layer is provided in a display substrate, and a plurality of light-emitting devices is correspondingly disposed in a plurality of hollow areas on the light-absorbing layer. Meanwhile, a color filter and a color conversion layer in a color filter
(Continued)

100 substrate are disposed correspondingly with the light-emitting devices. The problem of poor display performance caused by light crosstalk between adjacent pixels is avoided, and the display effect of the display panel is improved.

18 Claims, 4 Drawing Sheets

(51) Int. Cl.
*H10H 20/851* (2025.01)
*H10H 20/856* (2025.01)
*H10W 90/00* (2026.01)

(52) U.S. Cl.
CPC .......... *H10H 20/856* (2025.01); *H10W 90/00* (2026.01); *H10H 20/0361* (2025.01); *H10H 20/0363* (2025.01)

(56) References Cited

U.S. PATENT DOCUMENTS

| | | | | |
|---|---|---|---|---|
| 2013/0026341 | A1* | 1/2013 | Murata | C09K 9/02 428/220 |
| 2017/0292912 | A1* | 10/2017 | Ho | G01N 15/00 |
| 2017/0358604 | A1* | 12/2017 | Lee | H10D 86/451 |
| 2018/0326693 | A1* | 11/2018 | Kuniyasu | G02B 5/206 |
| 2019/0165316 | A1* | 5/2019 | An | H10K 59/8722 |
| 2021/0273202 | A1* | 9/2021 | Liu | H10K 59/878 |
| 2021/0288117 | A1* | 9/2021 | Lim | H10K 50/115 |
| 2021/0320087 | A1* | 10/2021 | Imada | H10H 20/855 |
| 2021/0408162 | A1* | 12/2021 | Joo | H10K 59/122 |
| 2022/0140014 | A1* | 5/2022 | Shim | H10K 59/126 257/40 |

FOREIGN PATENT DOCUMENTS

| | | | |
|---|---|---|---|
| CN | 110970546 | A | 4/2020 |
| CN | 113066830 | A | 7/2021 |
| CN | 113437052 | A | 9/2021 |
| CN | 113437241 | A | 9/2021 |
| CN | 113745388 | A | 12/2021 |
| CN | 113764601 | A | 12/2021 |
| TW | I277779 | B | 4/2007 |
| WO | 2011062351 | A1 | 5/2011 |

OTHER PUBLICATIONS

Written Opinion of the International Search Authority in International application No. PCT/CN2021/143347, mailed on May 26, 2022.

Patent proposal evaluation opinion form.

Office Action in related CN Application 202111656316.2 dated May 20, 2026.

* cited by examiner

DISPLAY PANEL AND MANUFACTURING METHOD THEREOF

CROSS-REFERENCE TO RELATED APPLICATIONS

This application is a national stage of International Application No. PCT/CN2021/143347, filed on Dec. 30, 2021, the disclosure of which is incorporated herein by reference in its entirety.

TECHNICAL FIELD

The present application relates to the field of display technology, and in particular to a display panel and a manufacturing method thereof.

BACKGROUND

A micro light emitting diode (Micro LED) display is a next-generation display technology after liquid crystal display and OLED display. Micro LED display panels use LED light-emitting chips (Micro LED chips) with sizes ranging from a few microns to tens of microns as pixel units, the Micro LED chips are closely arranged in an array, and each chip can be independently driven to emit a light. Micro LED display panels have many advantages such as self-illumination, high efficiency, long service life, and ultra-high resolution.

Technical Problem

However, existing Micro LED display panels are prone to light crosstalk between adjacent pixels, resulting in poor display effects.

Technical Solutions

The embodiments of the present application provide a display panel and a manufacturing method thereof, which can avoid the problem of poor display effects due to light crosstalk between adjacent pixels, and can improve the display effect of the display panel.

In a first aspect, the embodiments of the present application provide a display panel, including:

a display substrate, the display substrate includes a TFT substrate and a plurality of light-emitting devices and a light-absorbing layer, wherein the plurality of light-emitting devices and the light-absorbing layer are provided on a side of the TFT substrate, one of the plurality of light-absorbing layers is provided in a spacing area in the plurality of light-emitting device, and the light-absorbing layer is provided around the plurality of light-emitting device;

a color filter substrate, the color filter substrate is disposed opposite to the display substrate, the color filter substrate includes a first substrate, a plurality of color filters and a black matrix, wherein the plurality of color filters and the black matrix are provided on a side of the first substrate, wherein the black matrix is provided with a plurality of hollow areas, each of the plurality of color filters is disposed in a corresponding one of the plurality of hollow areas, and the color filter is disposed relative with a corresponding one of the plurality of light-emitting devices; the color filter substrate includes a plurality of color conversion layers and a plurality of reflective blocking walls, the plurality of color conversion layers are respectively provided on a side of each of the plurality of color filters away from the first substrate, the plurality of reflective blocking walls are provided on a side of the black matrix away from the first substrate;

wherein, a side of the display substrate provided with the plurality of light-emitting devices and the light-absorbing layer faces a side of the color filter substrate provided with the plurality of color conversion layers and the plurality of reflective blocking walls.

In some embodiments, a material of the light-absorbing layer includes a black metal oxide.

In some embodiments, the black metal oxide includes molybdenum oxide.

In some embodiments, the light-absorbing layer includes a first metal layer, a light-transmitting medium layer and a second metal layer stacked in sequence, wherein the first metal layer is provided adjacent to the TFT The substrate, the first metal layer includes one or more of copper, silver and aluminum, wherein the second metal layer includes one or more of molybdenum and titanium, and wherein the light-transmitting medium layer includes one or more of metal oxide, silicon oxide and silicon nitride.

In some embodiments, a material of the light-absorbing layer includes an organic black material.

In some embodiments, a material of the plurality of reflective blocking walls includes an organic material and an inorganic material, and wherein the organic material includes one or more of BT resin, silica gel, methyl methacrylate, and polyimide, wherein the inorganic material includes one or more of titanium dioxide and tantalum pentoxide.

In some embodiments, a height of each of the plurality of reflective blocking walls is greater than a height of each of the plurality of color conversion layers.

In some embodiments, a height difference between one of the plurality of reflective blocking walls and one of the plurality of color conversion layers is greater than 1/10 of a height of the light emitting device.

In some embodiments, a material of the plurality of reflective blocking walls is a hydrophilic material, and a material of the plurality of color conversion layers is a hydrophobic material.

In some embodiments, the side of the display substrate provided with the plurality of light-emitting devices and the light-absorbing layer is connected with the side of the color filter substrate provided with the plurality of color conversion layers and the plurality of reflective blocking walls through an adhesive layer.

In a second aspect, some embodiments of the present application provide a manufacturing method of a display panel, comprising:

providing a TFT substrate, wherein a plurality of light-emitting devices is transferred on the TFT substrate;

forming a light-absorbing layer on the TFT substrate, and the light-absorbing layer is provided in a spacing area in each of the plurality of light-emitting devices, and the light-absorbing layer is provided around each of the plurality of light-emitting devices to form a display substrate;

providing a first base, the first base includes a first substrate, a plurality of color filters and a black matrix, wherein the plurality of color filters and the black matrix are provided on a side of the first substrate, the black matrix is provided with a plurality of hollow areas, each of the plurality of color filters is disposed in a corresponding one of the plurality of hollow areas, and the color filter is disposed relative with a corresponding one of the plurality of light-emitting devices;

forming a plurality of color conversion layers respectively on a side of each of the plurality of color filters away from the first substrate, and forming a plurality of reflective blocking walls on a side of the black matrix away from the first substrate to form a color filter substrate;

providing an adhesive layer between a side of the display substrate provided with the plurality of light-emitting devices and the light-absorbing layer and a side of the color filter substrate provided with the plurality of color conversion layers and a plurality of the reflective blocking walls to connect the display substrate and the color filter substrate to form the display panel.

In some embodiments, a material of the reflective blocking wall is a hydrophilic material, and a material of the plurality of color conversion layers is a hydrophobic material.

forming the plurality of color conversion layers on a side of the plurality of color filters away from the first substrate includes: forming the plurality of color conversion layers using a doctor-coating process;

forming the reflective blocking wall on a side of the black matrix away from the first substrate includes: forming the reflective blocking wall using a spraying process.

Beneficial Effects

In the display panel provided by the embodiment of the present application, by providing light-absorbing layer in the display substrate, a plurality of light-emitting devices is correspondingly disposed in a plurality of hollow areas on the light-absorbing layer, meanwhile, a color filter and a color conversion layer in a color filter substrate are disposed correspondingly with the light-emitting devices, and the light-absorbing layer can be used to absorb the light emitted into the spacing area in the light-emitting device on the display substrate, so as to avoid interference caused by the reflection of light emitted by light-emitting devices onto the color conversion layer and the color filter of the adjacent pixels through the surface of the spacing area, thereby avoiding the problem of poor display performance caused by light crosstalk between adjacent pixels, which is beneficial to improving the display effect of the display panel.

BRIEF DESCRIPTION OF THE DRAWINGS

In order to explain the technical solutions in some embodiments of the present application more clearly, the drawings needed to be used in the description of the embodiments will be briefly introduced below. It should be understood, the drawings in the following description are only some embodiments of the present application, for those skilled in the art, other drawings can be obtained based on these drawings without exerting creative efforts.

EMBODIMENTS OF THE INVENTION

Detailed Description of the Preferred Embodiments

The technical solutions in some embodiments of the present application will be clearly and completely described below with reference to the accompanying drawings in some embodiments of the present application. It should be understood, the described embodiments are only some of the embodiments of the present application, but not all of the embodiments. Based on the embodiments in this application, all other embodiments obtained by those skilled in the art without creative efforts fall within the scope of protection of this application.

Figure 1:
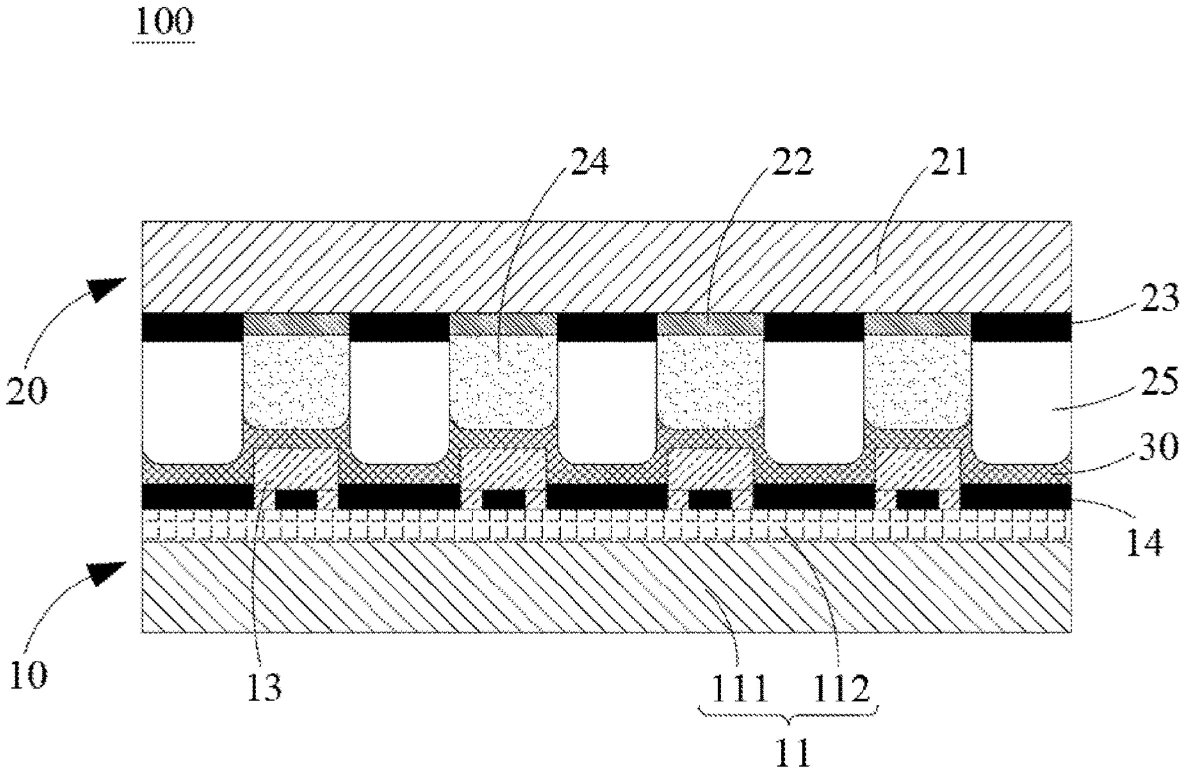
FIG. 1 is a schematic structural diagram of a display panel according to some embodiments of the present application.

Referring to FIG. 1, FIG. 1 is a schematic structural diagram of a display panel according to some embodiments of the present application. Some embodiments of the present application provide a display panel 100, which includes a display substrate 10 and a color filter substrate 20 disposed oppositely.

The display substrate 10 includes a TFT substrate 11, a plurality of light-emitting devices 13 and a light-absorbing layer 14, wherein the plurality of light-emitting devices 13 and the light-absorbing layer 14 provided on a side of the TFT substrate 11. The light-absorbing layer 14 is provided in the spacing area in each of the plurality of light-emitting devices 13 and around each of the plurality of light-emitting devices 13 (That is, the light-absorbing layer 14 is provided between two adjacent light-emitting devices 13, and the light-absorbing layer 14 is also provided at the edge position outside the light-emitting device 13).

The color filter substrate 20 includes a first substrate 21, a plurality of color filters 22 and a black matrix 23, wherein the plurality of color filters 22 and the black matrix 23 provided on a side of the first substrate 21. The black matrix 23 is provided with a plurality of hollow areas, each of the plurality of color filters 22 is disposed in a corresponding one of the plurality of hollow areas, and the color filter 22 is disposed relative with a corresponding one of the plurality of light-emitting devices 13; the color filter substrate 20 also includes a plurality of color conversion layers 24 and a plurality of reflective blocking walls 25, the color conversion layers 24 are provided on a side of the color filter 22 away from the first substrate 21, and the reflective blocking wall 25 is provided on a side of the black matrix 23 away from the first substrate 21.

The side of the display substrate 10 provided which the plurality of light-emitting devices 13 and the light-absorbing layer 14 faces the side of the color filter substrate 20 on which the plurality of color conversion layers 24 and the reflective blocking wall 25 are located.

In some embodiments, the side of the display substrate 10 on which the plurality of light-emitting devices 13 and the light-absorbing layer 14 are disposed is connected with the side of the color filter substrate 20 provided with the plurality of color conversion layers 24 and the reflective blocking wall 25 through an adhesive layer 30.

It should be understood that in the display panel 100 provided by the embodiment of the present application, it can be defined that in the vertical direction, one light-emitting device 13, one color conversion layer 24, and one color filter 22 correspond to each other to form one pixel. When the display panel 100 displays a picture and requires the light-emitting device 13 in a certain pixel to emit light, the reflective effect on the surface of the spacing area in light-emitting device 13 on the display substrate 10 may lead the light reflected from the spacing area to pass through the adhesive layer 30 and enter the color conversion layer 24 and color filter 22 of adjacent pixels to cause interference to adjacent pixels. Especially, the crosstalk of reflected light may accidently light up the adjacent pixels which are not need to be lit, resulting in poor display. This application provides a light-absorbing layer 14 on the surface of the spacing area in the light-emitting device 13 on the display substrate 10, which can effectively solve the problem of light crosstalk caused by reflection and improve the display effect of the display panel 100.

In the display panel 100 provided by the embodiment of the present application, a light-absorbing layer 14 is provided in the display substrate 10, a plurality of light-emitting devices 13 is corresponding disposed in a plurality of hollow areas on the light-absorbing layer 14, and the color filter 22 and the color conversion layer 24 in the color filter substrate 20 are disposed correspondingly with the light-emitting devices 13. The light-absorbing layer 14 can be used to absorb the light emitted to the spacing area in the light-emitting device 13 on the display substrate 10 to avoid interference caused by reflecting light emitted by light-emitting devices 13 through the surface of the spacing area onto the color conversion layer 24 and the color filter 22 of the adjacent pixels. Thus, the problem of poor display performance caused by light crosstalk between adjacent pixels is avoided, and the display effect of the display panel 100 is improved.

Referring to FIG. 1. The TFT substrate 11 includes a stacked second substrate 111 and a TFT device layer 112, wherein the plurality of light-emitting devices 13 and the light-absorbing layer 14 are provided on a side of the TFT device layer 112 away from the second substrate 111, and the plurality of light-emitting devices 13 are electrically connected to the TFT device layer 112.

In some embodiments, a material of the light absorbing layer 14 is black metal oxide. In some embodiments, the black metal oxide is molybdenum oxide.

Figure 2:
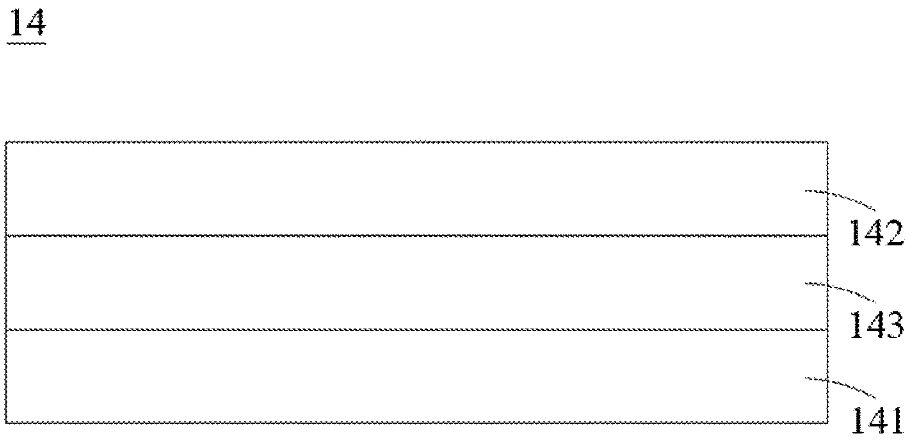
FIG. 2 is a schematic structural diagram of a light-absorbing layer according to some embodiments of the present application.

Referring to FIG. 2, FIG. 2 is a schematic structural diagram of the light-absorbing layer according to some embodiments of the present application. In some embodiments, the light-absorbing layer 14 includes a first metal layer 141, a light-transmitting medium layer 143, and a second metal layer 142 stacked in sequence. The first metal layer 141 is disposed adjacent to the TFT substrate 11. The first metal layer 141 includes one or more of copper (Cu), silver (Ag) and aluminum (AL); the second metal layer 142 includes one or more of molybdenum (Mo) and titanium (Ti); and the light-transmitting medium layer 143 includes one or more of metal oxide, silicon oxide (SiOx), and silicon nitride (SiNx).

It should be noted that by arranging the light-absorbing layer 14 into a structure in which the first metal layer 141, the light-transmitting medium layer 143 and the second metal layer 142 are stacked in sequence; the first metal layer 141, the light-transmitting medium layer 143 and the second metal layer 142 can form a resonant cavity. Since the material of the second metal layer 142 (molybdenum, titanium) has better light absorption properties, part of the light entering the second metal layer 142 is absorbed, and the other part of the light passes through the second metal layer 142 and enters the resonant cavity. After entering the resonant cavity, the light can be reflected back and forth between the second metal layer 142 and the first metal layer 141, but can no longer be emitted from the second metal layer 142, thereby achieving the light absorption effect. In addition, compared with the solution in which all materials of the light-absorbing layer 14 are made of molybdenum and/or titanium, this stacked structure costs relatively lower on material.

In other embodiments, the material of the light absorbing layer 14 includes organic black materials. In some embodiments, the organic black material is a mixture of organic resin material and black pigment.

It should be understood that the function of the reflective blocking wall 25 is to separate adjacent pixels and prevent the emitted light of the light-emitting device 13 and the emitted light of the color conversion layer 24 in one pixel from entering the color conversion layer 24 and color filter 22 in the adjacent pixel, thereby preventing interference to adjacent pixels. In some embodiments, the reflectivity of the reflective blocking wall 25 is above 85%, such as 85%, 90%, 95%, 100%, etc.

In some embodiments, a material of the reflective blocking wall 25 includes an organic material and an inorganic material, wherein the organic material includes one or more of BT resin, silica gel, methyl methacrylate (MMA), and polyimide (PI). The BT (Bismaleimide triazine) resin is prepared by using bismaleimide (BMI) and triazine as the main resin components, and adding epoxy resin, polyphenylene ether resin (PPE) or allyl compounds as modified components, to form a thermosetting resin. The inorganic material includes one or more of titanium dioxide ($TiO2$) and tantalum pentoxide ($Ta2O5$).

In some embodiments, the color of the reflective blocking wall 25 is white.

In some embodiments, the height of the reflective blocking wall 25 is greater than the height of the color conversion layer 24, so that the emitted light of the color conversion layer 24 in adjacent pixels can be prevented from interfering with each other.

In some embodiments, the height difference between the reflective blocking wall 25 and the color conversion layer 24 is between 1/10 and 1/2 of the height of the light emitting device 13 (for example, 1/10, 1/9, 1/8, 1/7, 1/6, 1/5, 1/4, 1/3, 1/2, etc.).

In some embodiments, the height of the reflective blocking wall 25 is 20 μm or more (for example, 20 μm, 23 μm, 25 μm, 28 μm, 30 μm, etc.).

In some embodiments, the material of the reflective blocking wall 25 is a hydrophilic material, and the material of the color conversion layer 24 is a hydrophobic material. In this case, the polarities of the materials of the reflective blocking wall 25 and the material of the color conversion layer 24 are mutually exclusive. Therefore, the reflective blocking wall 25 can be manufactured by spraying. When the polarities of the materials are mutually exclusive, the material of the reflective blocking wall 25 cannot be adsorbed on the color conversion layer 24 thereby avoiding a pollution. In addition, in some embodiments of the present application, due to the low cost of the spraying process, the manufacturing cost of the reflective blocking wall 25 is low.

Specifically, the material of the color conversion layer 24 includes one or more of quantum dot materials, phosphor materials, and phosphorescent photoluminescent materials. In some embodiments, the quantum dot material includes one or more of CdS/CdSe, InP, and perovskite quantum dots, and wherein the phosphor material includes one or more of YAG phosphor, silicate phosphor, and nitride phosphor. The phosphorescent photoluminescence materials include KSF.

In some embodiments, the color conversion layer 24 may convert the light emitted by the light-emitting device 13 into light with a wavelength ranging from 500 nm to 660 nm.

In some embodiments, the light converted by the color conversion layer 24 can be a combination of green light (G) and red light (R), yellow light (Y); a combination of yellow light (Y) and red light (R); and a combination of green light (G) and orange light (O), etc.

In some embodiments, the plurality of light-emitting devices 13 can all be blue light-emitting devices, and the light converted by the color conversion layer 24 can be a combination of green light and red light. In this case, the color conversion layer 24 generates green excitation light and red excitation light under the excitation of blue light emitted by the light-emitting device 13, wherein the green excitation light, red excitation light and remaining unexcited blue light are mixed to form white light.

In some embodiments, the light-emitting device 13 is an LED chip. It should be understood that compared with the technical solutions of transferring red light Micro LED chips, green light Micro LED chips, and blue light Micro LED chips together, the plurality of light-emitting devices 13 are all blue-light light-emitting devices of the present application, and only a single-color chip (here is the blue Micro LED chip) needs to be transferred, which can increase the transfer efficiency of the LED chip by 3 times and reduce the transfer cost. In addition, because the cost of the blue Micro LED chip is cheaper than the red Micro LED chip and the green Micro LED chip, so the cost of LED chips can be further reduced.

In some embodiments, the pixel structure of the display panel 100 is RGBW, RGB, RGBC, RGBY, RGBC, RGBYC, RGBYM, RGBCM, RGBYC, WYCM and other pixel structure designs; where R is red, G is green, and B is blue, W is white, M is magenta (including B and R colors), Y is yellow (including G and R colors), and C is cyan (including B and G colors).

In some embodiments, the plurality of color filters 22 includes a red filter (used to form red pixels), a green filter (used to form green pixels), and a blue filter (used to form blue pixels), and transparent filters (used to form white pixels), magenta filters (used to form magenta pixels), yellow filters (used to form yellow pixels), cyan filters (used to form cyan pixels), etc.

In some embodiments, the material of black matrix 23 includes organic black materials. In some embodiments, the organic black material is a mixture of organic resin material and black pigment.

Figure 3:
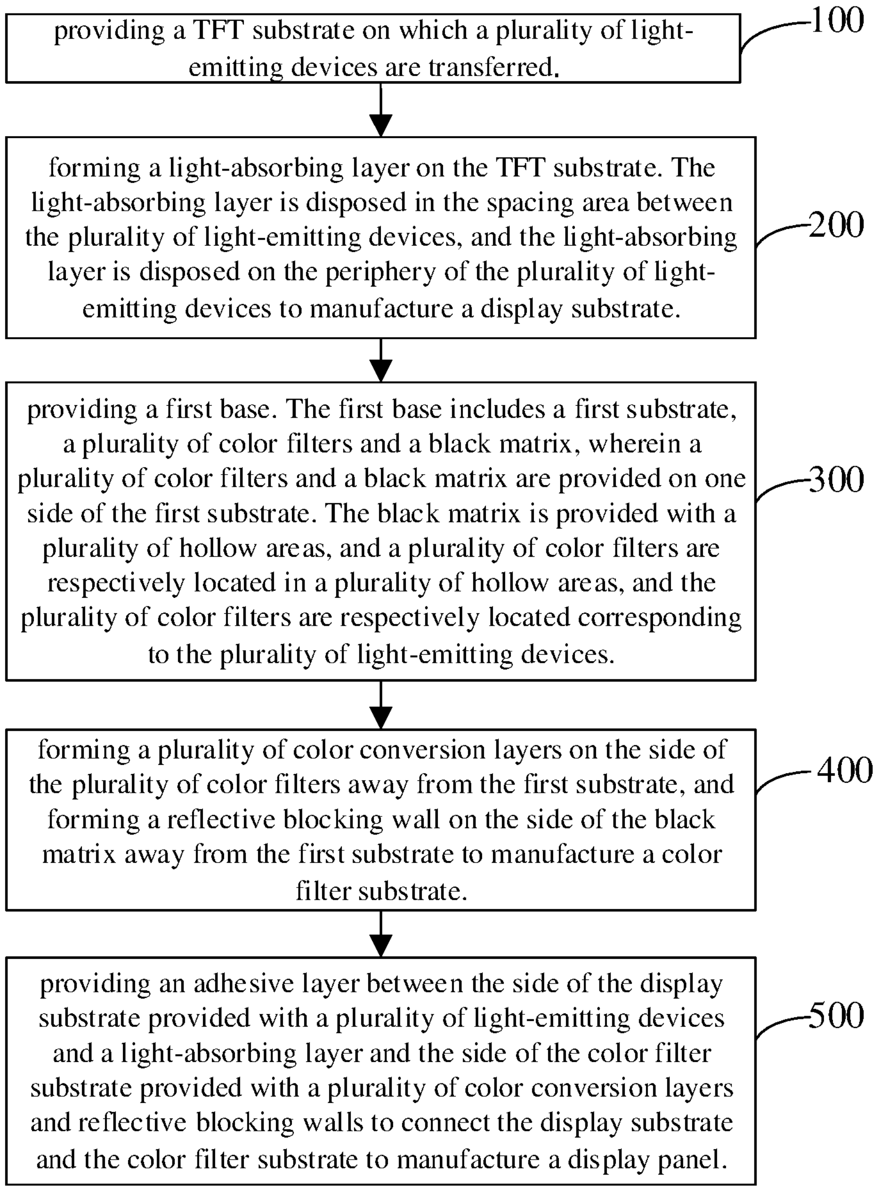
FIG. 3 is a schematic diagram of a method for manufacturing a display panel according to some embodiments of the present application.

Referring to FIG. 3, which is a schematic diagram of a method for manufacturing a display panel according to some embodiments of the present application. Some embodiments of the present application provide a method for manufacturing a display panel. This method can be used to form the display panel in any of the above embodiments. The manufacturing method includes:

100, providing a TFT substrate on which a plurality of light-emitting devices is transferred.

Figure 4:
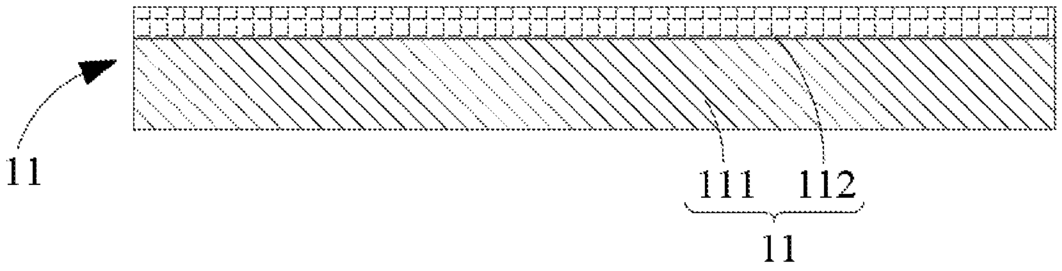
FIG. 4 is a schematic structural diagram of a TFT substrate according to some embodiments of the present application.

Referring to FIG. 4. FIG. 4 is a schematic structural diagram of a TFT substrate according to some embodiments of the present application. The TFT substrate 11 includes a stacked second substrate 111 and a TFT device layer 112, wherein a plurality of light-emitting devices 13 and a light-absorbing layer 14 are provided on the side of the TFT device layer 112 away from the second substrate 111.

Figure 5:
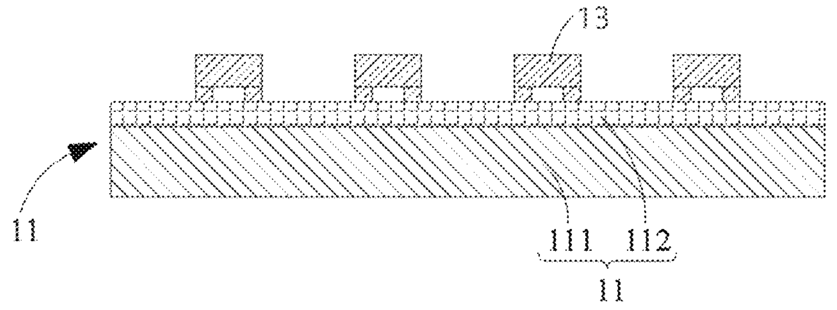
FIG. 5 is a schematic diagram of transferring a light-emitting device on a TFT substrate according to some embodiments of the present application.

Referring to FIG. 5, which is a schematic diagram of transferring a light-emitting device on a TFT substrate according to some embodiments of the present application. After the plurality of light-emitting devices 13 are transferred on the TFT substrate 11, the plurality of light-emitting devices 13 are electrically connected to the TFT device layer 112.

200, forming a light-absorbing layer on the TFT substrate. The light-absorbing layer is disposed in the spacing area in each of the plurality of light-emitting devices, and the light-absorbing layer is disposed around each of the plurality of light-emitting devices to form a display substrate.

Figure 6:
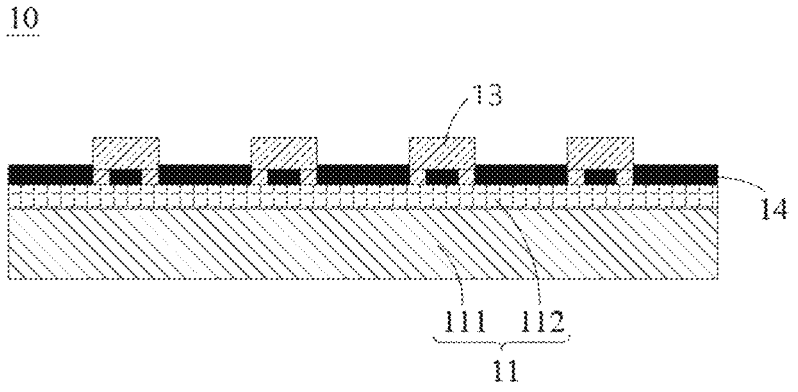
FIG. 6 is a schematic diagram of forming a light absorbing layer on a TFT substrate according to some embodiments of the present application.

Referring to FIG. 6, which is a schematic diagram of forming a light absorbing layer on a TFT substrate according to some embodiments of the present application. The light-absorbing layer 14 is provided in the spacing area in each of the plurality of light-emitting devices 13, and the light-absorbing layer 14 is provided around each of the plurality of light-emitting devices 13. When the material of the light-absorbing layer 14 is an organic black material, the light-absorbing layer 14 can be formed by coating (such as spraying, blade coating, etc.). When the material of the light absorbing layer 14 is black metal oxide, chemical vapor deposition can be used to form the light absorbing layer 14, when the light-absorbing layer 14 is made of a first metal layer 141, a light-transmitting medium layer 143, and a second metal layer 142 stacked in sequence, the first metal layer 141 and the second metal layer 142 can be formed by physical vapor deposition. The light-transmitting medium layer 143 can be formed by chemical vapor deposition.

300, providing a first base. The first base includes a first substrate, a plurality of color filters and a black matrix, wherein a plurality of color filters and a black matrix are provided on one side of the first substrate. The black matrix is provided with a plurality of hollow areas, each of the plurality of color filters is disposed in a corresponding one of the plurality of hollow areas, and the color filter is disposed relative with a corresponding one of the plurality of light-emitting devices.

Figure 7:
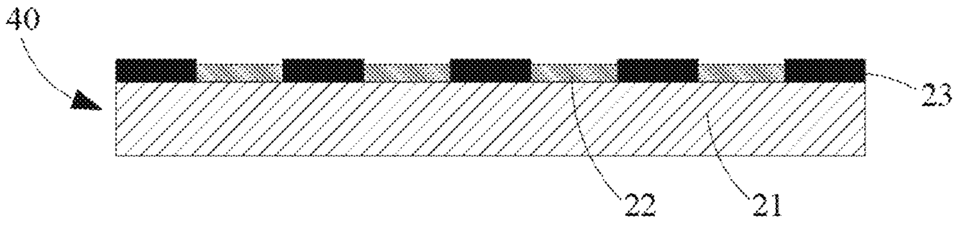
FIG. 7 is a schematic structural diagram of a first base according to some embodiments of the present application.

Referring to FIG. 7, which is a schematic structural diagram of a first substrate according to some embodiments of the present application. The first base 40 includes a first substrate 21 and a plurality of color filters 22 and a black matrix 23, wherein a plurality of color filters 22 and a black matrix 23 are provided on one side of the first substrate 21. The plurality of color filters 22 in the first base 40 includes a red filter, a green filter and a blue filter. When white light is transmitted through the above filters, red light, green light and blue light can be formed respectively. The black matrix 23 is correspond to the light absorbing layer 14.

400, forming a plurality of color conversion layers on the side of the plurality of color filters away from the first substrate, and forming a plurality of reflective blocking walls on the side of the black matrix away from the first substrate to form a color filter substrate.

Figure 8:
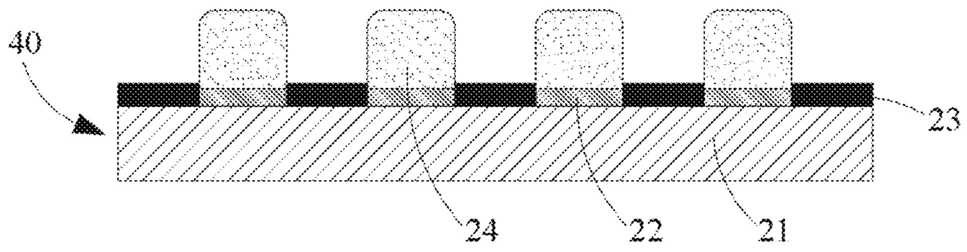
FIG. 8 is a schematic diagram of manufacturing a color conversion layer on a first base according to some embodiments of the present application.
Figure 9:
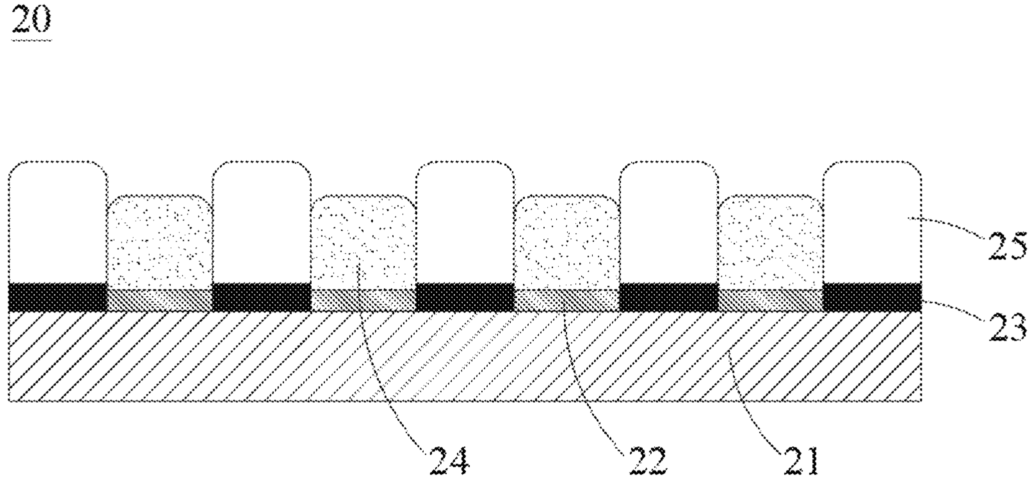
FIG. 9 is a schematic diagram of manufacturing a plurality of reflective blocking walls on the first base according to some embodiments of the present application.

Referring to FIG. 8. FIG. 8 is a schematic diagram of manufacturing a color conversion layer on a first substrate according to some embodiments of the present application. A plurality of color conversion layers 24 are respectively formed on the side of the plurality of color filters 22 away from the first substrate 21. Referring to FIG. 9. FIG. 9 is a schematic diagram of manufacturing a plurality of reflective blocking walls on the first substrate according to some embodiments of the present application, a plurality of reflective blocking walls is formed on the side of the black matrix 23 away from the first substrate 21 to obtain color filter substrate 20. In some embodiments, the material of the reflective blocking wall 25 is a hydrophilic material, and the material of the color conversion layer 24 is a hydrophobic material; "Forming a plurality of color conversion layers 24 on the side of the plurality of color filters 22 away from the first substrate 21" may specifically include: forming a plurality of color conversion layers 24 using a blade coating process; "forming the reflective blocking wall 25 on the side of the black matrix 23 away from the first substrate 21" may specifically include: forming the reflective blocking wall 25 using spray coating process.

It should be understood that due to the low cost of the blade coating process and the wide range of materials that can be selected for the blade coating process, the material cost of the color conversion layer 24 can be further reduced, so compared with the existing manufacturing processes of the color conversion layer 24 (including yellow light process and/or inkjet printing process), the solution of the present application using the blade coating process to form the color conversion layer 24 can significantly reduce the production cost of the color conversion layer 24.

It should be noted that in some embodiments of the present application, there is no order of manufacturing for the display substrate and the color filter substrate. That is, the display substrate and the color filter substrate can be manufactured simultaneously, or the display substrate can be manufactured first followed by the color filter, or the color filter substrate can be manufactured first followed by the display substrate.

500, providing an adhesive layer between the side of the display substrate provided with a plurality of light-emitting devices and a light-absorbing layer and the side of the color filter substrate provided with a plurality of color conversion layers and reflective blocking walls to connect the display substrate and the color filter substrate to form a display panel.

Referring to FIG. 1, it should be understood that the adhesive layer 30 must be a light-transmitting adhesive layer so that the light emitted by the light-emitting device 13 can enter the color conversion layer 24 through the adhesive layer 30.

The display panel and its manufacturing method provided by the embodiments of the present application are introduced in detail above. This article uses specific examples to illustrate the principles and implementation methods of the present application. The description of the above embodiments is only used to help understand the present application. At the same time, for those skilled in the art, there will be changes in the specific implementation and application scope based on the ideas of the present application. In summary, the content of this description should not be understood as a limitation of the present application.

What is claimed is:

1. A display panel, comprising:

a display substrate, wherein the display substrate includes a TFT substrate, a plurality of light-emitting devices, and a light-absorbing layer; the plurality of light-emitting devices and the light-absorbing layer are provided on a side of the TFT substrate; the light-absorbing layer is provided in a spacing area in each of the plurality of light-emitting devices; and the light-absorbing layer is provided around each of the plurality of light-emitting devices; and a color filter substrate, wherein the color filter substrate is disposed opposite to the display substrate; the color filter substrate includes a first substrate, a plurality of color filters, and a black matrix; the plurality of color filters and the black matrix are provided on a side of the first substrate; wherein the black matrix is provided with a plurality of hollow areas, each of the plurality of color filters is disposed in a corresponding one of the plurality of hollow areas, and the color filter is disposed relative with a corresponding one of the plurality of light-emitting devices; wherein the color filter substrate includes a plurality of color conversion layers and a plurality of reflective blocking walls, each of the plurality of color conversion layers is provided on a side of the color filter away from the first substrate, the plurality of reflective blocking walls are provided on a side of the black matrix away from the first substrate;

wherein a side of the display substrate provided with the plurality of light-emitting devices and the light-absorbing layer faces a side of the color filter substrate provided with the plurality of color conversion layers and the plurality of reflective blocking walls, wherein the light-absorbing layer comprises a first metal layer, a light-transmitting medium layer, and a second metal layer stacked in sequence, wherein the first metal layer is provided adjacent to the TFT substrate; the first metal layer comprises one or more of copper, silver and aluminum; the second metal layer comprises one or more of molybdenum and titanium; and the light-transmitting medium layer comprises one or more of metal oxide, silicon oxide and silicon nitride.

2. The display panel of claim 1, wherein a material of the light-absorbing layer comprises a black metal oxide.

3. The display panel of claim 2, wherein the black metal oxide comprises a molybdenum oxide.

4. The display panel of claim 1, wherein a material of the light-absorbing layer comprises an organic black material.

5. The display panel of claim 1, wherein a material of the plurality of reflective blocking walls comprises an organic material and an inorganic material; the organic material comprises one or more of BT resin, silica gel, methyl methacrylate, and polyimide; and the inorganic material comprises one or more of titanium dioxide and tantalum pentoxide.

6. The display panel of claim 1, wherein a height of each of the plurality of reflective blocking walls is greater than a height of the color conversion layer.

7. The display panel of claim 6, wherein a height difference between the reflective blocking wall and the color conversion layer is greater than 1/10 of a height of the light-emitting device.

8. The display panel of claim 1, wherein a material of the plurality of reflective blocking walls comprises a hydrophilic material, and the plurality of color conversion layers is made of a hydrophobic material.

9. The display panel of claim 1, wherein the side of the display substrate provided with the plurality of light-emitting devices and the light-absorbing layer faces is adhered to the side of the color filter substrate provided with the plurality of color conversion layers and the plurality of reflective blocking walls through an adhesive layer.

10. A manufacturing method of a display panel, comprising:

providing a TFT substrate, wherein a plurality of light-emitting devices is transferred on the TFT substrate;

forming a light-absorbing layer on the TFT substrate, wherein the light-absorbing layer is provided in a spacing area in each of the plurality of light-emitting devices and around each of the plurality of light-emitting devices to define a display substrate;

providing a first base, wherein the first base comprises a first substrate, a plurality of color filters, and a black matrix; wherein the plurality of color filters and the black matrix are provided on a side of the first substrate, the black matrix is provided with a plurality of hollow areas, each of the plurality of color filters is disposed in a corresponding one of the plurality of hollow areas, and the color filter is disposed relative with a corresponding one of the plurality of light-emitting devices;

forming a plurality of color conversion layers on a side of each of the plurality of color filters away from the first substrate, and forming a plurality of reflective blocking walls on a side of the black matrix away from the first substrate, to define a color filter substrate; and providing an adhesive layer, wherein the adhesive layer is provided between a side of the display substrate provided with the plurality of light-emitting devices and the light-absorbing layer and a side of the color filter substrate provided with the plurality of color conversion layers and the reflective blocking wall, to connect the display substrate and the color filter substrate to form the display panel, wherein the light-absorbing layer comprises a first metal layer, a light-transmitting medium layer, and a second metal layer stacked in sequence; the first metal layer is provided adjacent to the TFT substrate, the first metal layer comprises one or more of copper, silver and aluminum; the second metal layer comprises one or more of molybdenum and titanium; and the light-transmitting medium layer comprises one or more of metal oxide, silicon oxide, and silicon nitride.

11. The manufacturing method of claim 10, wherein a material of the reflective blocking wall comprises a hydrophilic material, and a material of the plurality of color conversion layers comprises a hydrophobic material.

12. The manufacturing method of claim 11, wherein the forming the plurality of color conversion layers on the side of each of the plurality of color filters away from the first substrate comprises: forming the plurality of color conversion layers using a doctor-coating process; and wherein the forming the reflective blocking wall on the side of the black matrix away from the first substrate comprises: forming the reflective blocking wall using a spraying process.

13. The manufacturing method of claim 10, wherein a material of the light-absorbing layer comprises a black metal oxide.

14. The manufacturing method of claim 13, wherein the black metal oxide comprises a molybdenum oxide.

15. The manufacturing method of claim 10, wherein a material of the light-absorbing layer comprises an organic black material.

16. The manufacturing method of claim 10, wherein a material of the reflective blocking wall comprises an organic material and an inorganic material, wherein the organic material comprises one or more of BT resin, silica gel, methyl methacrylate, polyimide, wherein the inorganic materials comprise one or more of titanium dioxide and tantalum pentoxide.

17. The manufacturing method of claim 10, wherein a height of the reflective blocking wall is greater than a height of each of the plurality of color conversion layers.

18. The manufacturing method of claim 17, wherein the height difference between the reflective blocking wall and the color conversion layer is greater than 1/10 of the height of the plurality of light-emitting device.

* * * * *